United States Patent [19]

Ngo et al.

[11] Patent Number: 4,903,189
[45] Date of Patent: Feb. 20, 1990

[54] LOW NOISE, HIGH FREQUENCY SYNCHRONOUS RECTIFIER

[75] Inventors: Khai D. T. Ngo, Schenectady; Robert L. Steigerwald, Burnt Hills; John P. Walden, Schenectady; Bantval J. Baliga, Schenectady; Charles S. Korman, Schenectady; Hsueh-Rong Chang, Scotia, all of N.Y.

[73] Assignee: General Electric Company, Schenectady, N.Y.

[21] Appl. No.: 186,983

[22] Filed: Apr. 27, 1988

[51] Int. Cl.[4] .......................................... H02M 7/217
[52] U.S. Cl. ..................................... 363/127; 357/234
[58] Field of Search ................ 363/123, 126, 127, 125; 357/23.6, 22, 23.4

[56] References Cited

U.S. PATENT DOCUMENTS

| | | | |
|---|---|---|---|
| 2,980,809 | 4/1961 | Teszner | 307/88.5 |
| 3,363,153 | 1/1968 | Zloczower | 317/125 |
| 3,855,608 | 12/1974 | George et al. | 357/22 |
| 3,909,700 | 9/1975 | Ferro | 363/127 X |
| 4,115,793 | 9/1978 | Nishizawa | 357/22 |
| 4,399,499 | 8/1983 | Butcher et al. | 363/127 X |
| 4,404,575 | 9/1983 | Nishizawa | 357/22 |
| 4,519,024 | 5/1985 | Federico et al. | 363/127 |
| 4,546,375 | 10/1985 | Blackstone et al. | 357/23.8 X |
| 4,685,041 | 8/1987 | Bowman et al. | 363/126 X |
| 4,791,462 | 12/1988 | Blanchard et al. | 357/23.4 |

FOREIGN PATENT DOCUMENTS 0145567 11/1983 European Pat. Off. .

Primary Examiner—Patrick R. Salce
Assistant Examiner—Kristine Peckman
Attorney, Agent, or Firm—Robert Ochis; James C. Davis, Jr.; Marvin Snyder

[57] ABSTRACT

A synchronous rectifier is able to operate at higher frequencies and provides an output having lower noise than prior art FET synchronous rectifier system by using field effect switching devices which contain only one conductivity type of semiconductor material and connecting a high speed, low charge storage diode in parallel. Schottky diodes are preferred whereby there is no junction diode in the structure. Conventional FETs may be used when paralleled with a Schottky diode which prevents the FET's parasitic internal diode from becoming conductive.

20 Claims, 5 Drawing Sheets

INPUT OR HIGH VOLTAGE SIDE

OUTPUT OR LOW VOLTAGE SIDE

PRIMARY OR HIGH VOLTAGE SIDE

SECONDARY OR LOW VOLTAGE SIDE

LOW NOISE, HIGH FREQUENCY SYNCHRONOUS RECTIFIER

RELATED APPLICATIONS

The present application is related to application Ser. No. 186,982 filed concurrently herewith and entitled "Single Conductivity UMOSFET" which is assigned to the instant assignee and is incorporated herein, in its entirety, by reference.

BACKGROUND OF THE INVENTION

1. Field of the Invention

The present invention relates to the field of rectifier circuits and more particularly, to synchronous rectifier circuits.

2. Prior Art

Semiconductor rectifiers have long been used in power supplies to convert an AC input voltage to a DC output voltage. As used herein, the term "rectifier" means a device whose internal structure conducts current in one polarity, but blocks current flow in the opposing polarity. Rectifiers include diodes and SCRs. Such DC power supplies may employ either half-wave rectification in which a single rectifier is used or full-wave rectification in which a transformer, a bridge circuit and two discrete rectifiers are used in order to rectify both halves of an AC input voltage. Such DC power supplies, in which the power supply DC output voltage is large compared to the ON-state voltage drop of the rectifier, provide fairly efficient conversion of an AC input voltage to a DC output voltage. However, as the power supply DC output voltage becomes a smaller multiple of the rectifier forward voltage drop, the power conversion efficiency of the power supply decreases because of an increase in the percentage of the AC input power which is dissipated in the rectifiers.

One way of minimizing the power loss in the rectifying devices of a DC power supply is to use synchronous rectification rather than discrete rectifiers to convert the AC input voltage to a DC output voltage In a synchronous rectifier, the rectification is performed by semiconductor switching devices operating under the control of a synchronized timing circuit. The switching devices in a synchronous rectifier circuit are capable of conducting current in both directions and may be normally off until turned on by a control signal, or normally on until turned off by a control signal or may require a control signal for both turn on and turn off.

The term "rectifying device" as used herein refers to a device which rectifies the AC current/voltage therethrough, independent of how it achieves that function. Thus, the term "rectifying device" includes the switching devices in a synchronous rectifier circuit as well as rectifiers per se. In a synchronous rectifier circuit, a control signal is provided to the switching device which causes it to be conductive when the voltage applied across it is of one polarity and to be non-conductive when the voltage applied across it is zero or of the opposite polarity. Where the rectifying device is a field effect transistor (FET) or another device whose forward voltage drop is less than that of a rectifier (diode), the portion of the applied power dissipated in the rectifying device of a synchronous rectifier circuit is reduced as compared to that dissipated in the rectifier for the same DC output voltage. Bipolar transistors, as well as FETs, have been used as the rectifying devices in synchronous rectifier circuits. In order to maximize the efficiency and density of such synchronous rectifiers, the rectifying devices used therein should have as small an inherent ON-state voltage drop as possible and should have as low an ON-resistance per unit area as possible.

Prior art devices which have been used as rectifying devices in synchronous rectification either have an internal structure which limits the maximum frequency at which they can rectify high amplitude currents/voltages and/or include parasitic devices which prevent the synchronous rectifier from operating in an ideal manner. We have found that the maximum operating frequency of a FET synchronous rectifier circuit is limited by parasitic diodes and a parasitic bipolar transistor which are inherent in the FET. In an FET based synchronous rectifier circuit one of the parasitic diodes within the FET becomes conductive at some stages in the operating cycle of a synchronous rectifier and cause switching noise which is present in the DC output voltage and may also interfere with the synchronous control system. The parasitic bipolar transistor in an FET can cause destruction of the FET under some circuit conditions.

Accordingly, it is an object of the present invention to provide a synchronous rectifier circuit which is substantially free of parasitic bipolar transistor and diode devices.

It is another object to provide a synchronous rectifier system in which lossy parasitic diodes are prevented from becoming conductive.

It is a further object to provide a synchronous rectifier system having fast diodes in place of slow diodes.

SUMMARY OF THE INVENTION

The foregoing and other objects are achieved in a synchronous rectifier circuit in which the rectifying devices are field effect devices whose conductivity is controlled by an insulated gate and which are free of parasitic devices. These rectifying devices incorporate only a single conductivity type of semiconductor material and thus are free of PN junctions and parasitic bipolar and diode devices. High speed, low storage diodes such as Schottky diodes are connected in parallel with these rectifying devices to conduct transient currents with a minimal adverse effect on circuit performance.

In an alternative embodiment, prior art FETs having an NPN or PNP internal structure may be used as the rectifying devices when Schottky diodes are connected in parallel to prevent the parasitic diodes in the FETs from becoming conductive.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
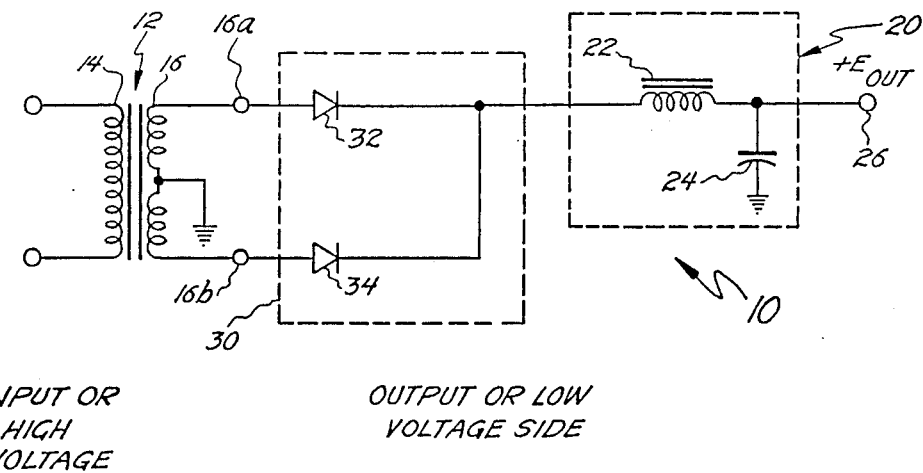
FIG. 1 is a schematic illustration of the isolation transformer/rectifier stage of a rectifier power supply in accordance with the prior art.

FIG. 1 is a schematic diagram of the isolation transformer/rectifier stage 10 of a prior art full-wave rectifier power supply. This isolation transformer/rectifier stage comprises an isolation transformer 12, a DC output filter 20 and a rectification system 30. This portion of the power supply is also known as the rectifier stage. The transformer 12 has a primary winding 14 which is the input side of the transformer and which serves as the AC input for the isolation transformer/rectifier stage. Transformer 12 has a secondary winding 16 having a grounded center tap. A first diode rectifier 32 is connected between a first end 16a of the secondary winding and the output filter 20. A second diode rectifier 34 is connected between the second end 16b of the secondary winding and the output filter 20. Diodes 32 and 34 have their cathodes connected in common to the input of the output filter 20. The output filter 20 comprises an inductor 22 and a holding capacitor 24 which are connected in series between the common connection of the rectifiers and ground. The isolation/rectification stage output terminal 26 is connected to the common connection of the inductor 22 and the capacitor 24.

Power losses in isolation transformer/rectifier stage 10 arise in several ways. First, each of the diodes dissipates power when it is conducting since it has an inherent, non-zero, ON-state voltage drop which is substantially independent of the current flow therethrough. The power dissipated in each diode is equal to the voltage drop across the diode when it is ON times the average current through the diode. For silicon PN junction diodes, this inherent ON-state voltage drop is about 0.7 volts, while for a silicon P-I-N diode it is about 0.9 volts and for a Schottky diode it is about 0.5 volts. Second, other losses occur in the transformer, the connecting wiring, the inductor and the capacitor.

Power supplies employing rectifier stages of this type have been designed to provide a wide range of DC output voltages. For a fixed amplitude, fixed frequency AC input voltage at the primary winding 14, the DC output voltage of such a power supply is largely determined by the turns ratio of the transformer. Where either or both the input voltage amplitude or the input frequency are controllable, the DC output voltage from such a power supply depends on the turns ratio of the transformer and the control mechanism since the input amplitude and frequency can both affect the output voltage. The lower the output voltage $E_{OUT}$, the greater the percentage of power which is dissipated in the diodes 32 and 34, since their forward voltage drop is substantially independent of the output voltage provided by the power supply. This power loss has several detrimental effects. First, the power efficiency of the power supply is limited by this loss. Second, this loss involves the conversion of electrical energy to thermal energy which must be removed from the rectifiers to prevent them from overheating with consequent detrimental or catastrophic effects. Power supplies of this type have long been used with 60 Hz power lines to produce DC voltages for use in solid state circuits.

In an attempt to reduce the overall size of the power supply, power supplies employing this type of rectifier stage were later designed to operate the rectifier stage at substantially higher input frequencies. Such designs allow the use of smaller transformers for the same power level and, in some cases, reduce transformer losses and the heat produced thereby. The increase in frequency does little to reduce the power loss in the diodes because of their substantially fixed forward voltage drop. Where high DC voltages were desired, the rectifiers employed were often PIN diodes which have a forward voltage drop in the neighborhood of 0.9 volts for silicon devices. Schottky barrier diodes having a forward voltage drop of about 0.5 volts have been used in relatively low voltage power supplies in an attempt to reduce the power losses in the diodes. However, it was eventually recognized that to further reduce the power loss in the power supply, rectifying devices were needed which did not have a fixed lower limit on their voltage drop while conducting. Consequently, the synchronous rectifier circuit was developed.

Figure 2:
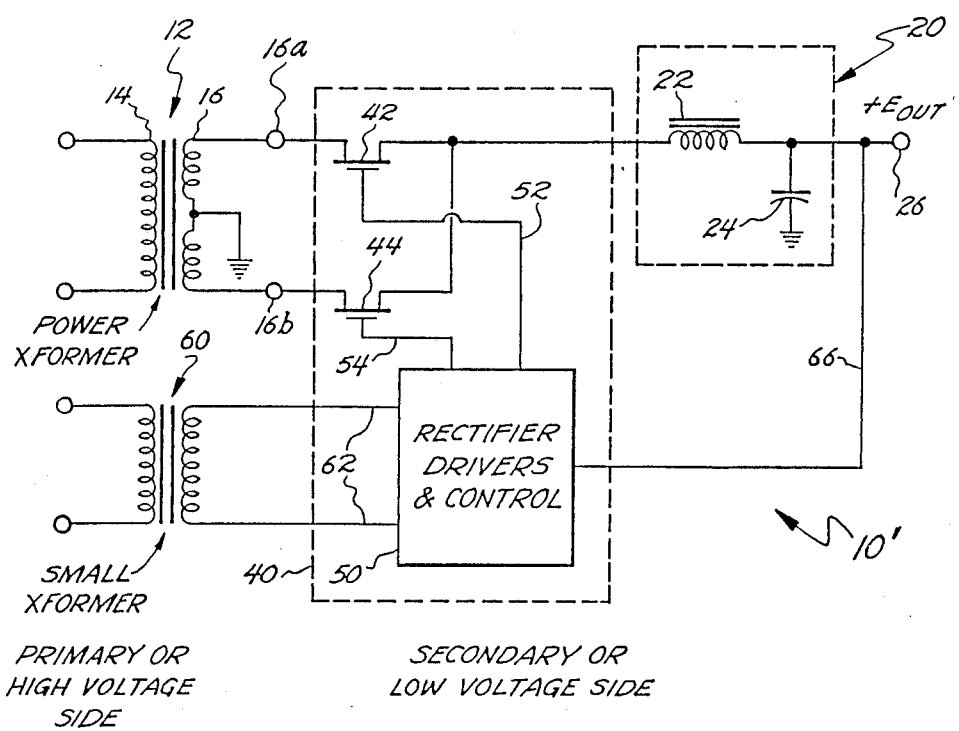
FIG. 2 is a schematic illustration of the isolation/transformer rectification stage of a synchronous rectifier power supply in accordance with the prior art.

The isolation transformer/rectification stage of a prior art synchronous rectifier circuit is shown in schematic form in FIG. 2. The synchronous rectifier stage 10' of FIG. 2 is similar to the diode rectifier stage 10 of FIG. 1 in having a transformer 12, an output filter 20, and a rectification section 40. For the same operating frequency and DC output voltage, the transformer 12 and the output filter 20 in the synchronous rectifier stage 10' may be identical to those in the diode rectifier stage 10. The most significant structural differences between the synchronous rectifier stage 10' and the diode rectifier stage 10 are in their rectification systems.

The rectification system 40 of isolation/rectification stage 10' replaces the diodes 32 and 34 of system 30 of isolation/rectification stage 10 with FETs 42 and 44, respectively. The connection of the FETs in the bridge circuit is similar to that of the diodes. However, since FETs are active switches which in normal operation, are switched in response to control signals applied to them rather than in response to the voltage across them, an external control system 50 is required in order to produce rectification. The control system 50 has control lines 52 and 54 connected to the gate terminals of the field effect transistors 42 and 44, respectively, to control their conduction. In addition, the control system 50 requires, as an input signal, either the AC signal applied to the primary winding 14 of the transformer 12 or a signal which provides the control system 50 with timing information as to the frequency of that AC signal and the timing of its zero crossings. In the isolation/rectification stage 10' of FIG. 2, this signal is provided through a small transformer 60 which has leads 62 connected to the control system 50. The turns ratio of the transformer 60 is determined in accordance with the input signal applied to its primary side and the voltage range which is suitable for application to the control system 50. Control system 50 may also receive the output voltage $E_{OUT}$ of the isolation/rectification stage as an input signal on line 66. The design of the control system 50 may follow any of a number of well-known designs.

The operation of the isolation/synchronous rectification stage is similar to that of the diode isolation/rectifier stage except that the conductivity of the switching devices must be controlled by the control system 50 since the required switching is not inherent in the structure of the rectifying device as it is in rectifiers. Thus, in response to the signals received on the input lines 62, the control system 50 applies a voltage to the control line 52 which renders the FET 42 conductive when the secondary terminal 16a is at a positive voltage. This enables current to flow from winding terminal 16a into the filter 20. To accomplish this, an ON signal is applied to lead 52 during the period of time when the voltage at the secondary terminal 16a is positive. Just before the voltage on the secondary reverses, the signal on lead 52 is changed to an OFF signal to turn FET 42 OFF. What those control signals are is dependent on the particular type of FET employed.

When the voltage at terminal 16b of the secondary becomes positive, a conduction or ON signal is applied to the lead 54 to render the FET 44 conductive. That ON signal is maintained on the lead 54 until the voltage at terminal 16b of the secondary once again decreases to zero. Just before that voltage becomes zero, the signal on the lead 54 is changed back to a non-conduction or OFF signal to shut off FET 44. In order to prevent placing a short circuit across the transformer secondary winding which would result in what is known as a shoot-through fault, the ON-periods of the control signals on lines 52 and 54 for FETs 42 and 44, respectively, are normally made slightly shorter than one half of the period of the input AC voltage in order to ensure that both FETs are not ON at the same time. During the time that both FETs are switched OFF in the vicinity of zero crossings of the secondary winding voltage, the inductance of inductor 22 forces the DC current therethrough to continue to flow. That current must come from the secondary winding and therefore must flow through a FET which is connected in series with that winding. An inherent parasitic diode exists in each of the FETs and this inherent parasitic diode in one of the FETs of the circuit turns ON to provide a current path for that current. This produces two detrimental effects. First, the inherent parasitic junction diodes are lossy and slow. As a result, power dissipation goes up and the recovery time of this diode on turn-off places an upper limit on the frequency at which the synchronous rectifier can operate. Second, in order for this diode to turn off, the current in the secondary winding to which that FET is connected must reverse in order to draw the stored charge out of the diode. This produces ringing, due to leakage inductances in the secondary winding. This ringing results in a noisy DC output voltage $E_{OUT}$ since the filter cannot fully suppress this noise. The magnitude of this ringing normally increases with increases in the reverse current's magnitude.

Figure 8:
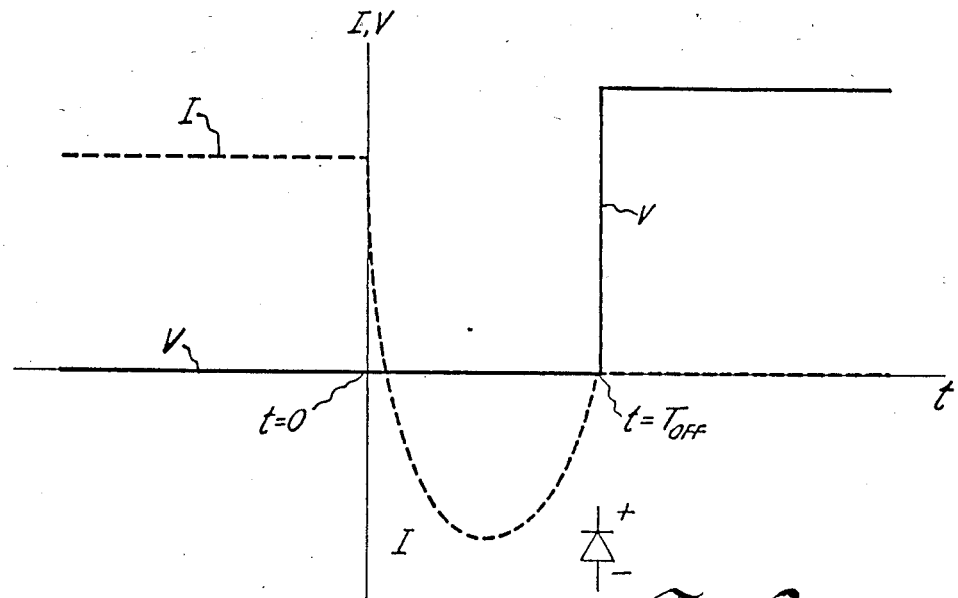
FIG. 8 illustrates the current in and the voltage across a diode during turn-off.

The current through a diode and the voltage across it around the time of turn-off are shown in graphic form in FIG. 8 for a reversal in the polarity of the voltage across it and the + and − convention for voltage shown adjacent to the diode symbol in FIG. 8. The current is at a positive level while the diode is on and the voltage across the diode is equal to one forward voltage drop as shown to the left of the vertical axis. At time t=0 when turn-off begins, the current in the diode begins to decrease and shortly thereafter reverses while the voltage across the diode remains essentially unchanged because of the charge stored in the diode. This reverse current continues until all of the charge stored in the diode has been removed by a combination of the current flow and internal recombination. When the stored charge has been removed at time $t=T_{OFF}$, the current drops to essentially zero and the voltage rises to a reverse bias voltage whose magnitude depends on the voltage applied by the external circuit. The negative current which flows during the time between t=0 and $t=T_{Off}$ causes ringing and other noise in the isolation transformer secondary winding and the power supply output.

While conducting, a FET of conventional structure designed and fabricated in accordance with prior art techniques to have a 25 volt blocking capability would have a minimum specific ON-resistance of about 0.2 milliohm-cm$^2$. For the same current density, in FETs 42 and 44 of FIG. 2 as in diodes 32 and 34 in the circuit of FIG. 1, the voltage drops across these rectifying devices is significantly different. The voltage drop across the rectifying devices (FETs 42 and 44) in isolation/rectification stage 10' is about the forward-biased-junction voltage of diodes 32 and 34 less than the voltage across the rectifying devices (diodes 32 and 34) in isolation/rectification stage 10. This would produce a corresponding reduction in conduction losses in the synchronous rectification circuit 10' relative to the diode rectifier circuit 10. This would enable the rectification stage 10' to be more energy efficient and importantly thereby, to dissipate less power and produce less heat, thus allowing the power supply to be provided in a smaller volume and/or with lower cooling requirements.

However, for very low voltage power supplies, the resistive voltage drop in the rectifying devices 42 and 44 is still a significant power loss. Even lower ON-resistance FETs are needed. A structure which aids in reducing the FET ON-resistance is a trench or UMOSFET gate structure in which the channel runs vertically through the base region portion of the wafer and the gate electrode is located in trenches which extend into the semiconductor body from one surface. A similar structure is the vertical charge control FET (VCCFET) in which the channel of the device runs vertically through the thickness of a semiconductor wafer — this is the source of the word "vertical" in the device name. The conductivity of this FET is controlled by disposing the gate electrode in trenches extending into the wafer from one surface. Voltage applied to the gate electrode controls the conductivity of the semiconductor mesas which separate the gate electrode segments and for appropriate mesa structure enables the device to hold off a larger voltage than normal UMOSFETs. This is known as charge control and is the source of the words "charge control" in the device name. Further information on VCCFETs and then fabrication is contained in U.S. patent applications Ser. No. 239,014, filed Aug. 26, 1988, as a continuation of application Ser. No. 267,757, filed Nov. 1, 1988, as a continuation of application Ser. No. 938,692 entitled "Semiconductor Devices Exhibiting Minimum On Resistance", filed Dec. 5, 1986, now abandoned and Ser. No. 938,666 entitled "Method of Fabricating a Semiconductor Device", filed Dec. 5, 1986, now abandoned both by Victor A. K. Temple, assigned to the instant assignee and incorporated herein by reference in their entirety. The fabrication method described therein is easily adapted to produce devices in accordance with this invention.

In order to operate a synchronous rectifier stage at high frequencies, the AC input signal is often provided by an inverter operating from an input DC voltage which is different than the output voltage to be provided by the power supply. Consequently, the frequency of the AC signal which is applied to the transformer 12 can be selected by the designer in accordance with other requirements and is not dependent on the frequency of an externally available AC voltage. In order to minimize the size of the transformer 12 and, with appropriate core materials, its losses, high frequency operation is desirable.

However, as the frequency of operation increases, the time period available for the parasitic diode to turn OFF is reduced. With normal FETs of the type used in synchronous rectifiers, the maximum operating frequency of the synchronous rectifier is limited to between about 0.5 Mhz and about 2 Mhz by this diode turn-off time.

Figure 7:
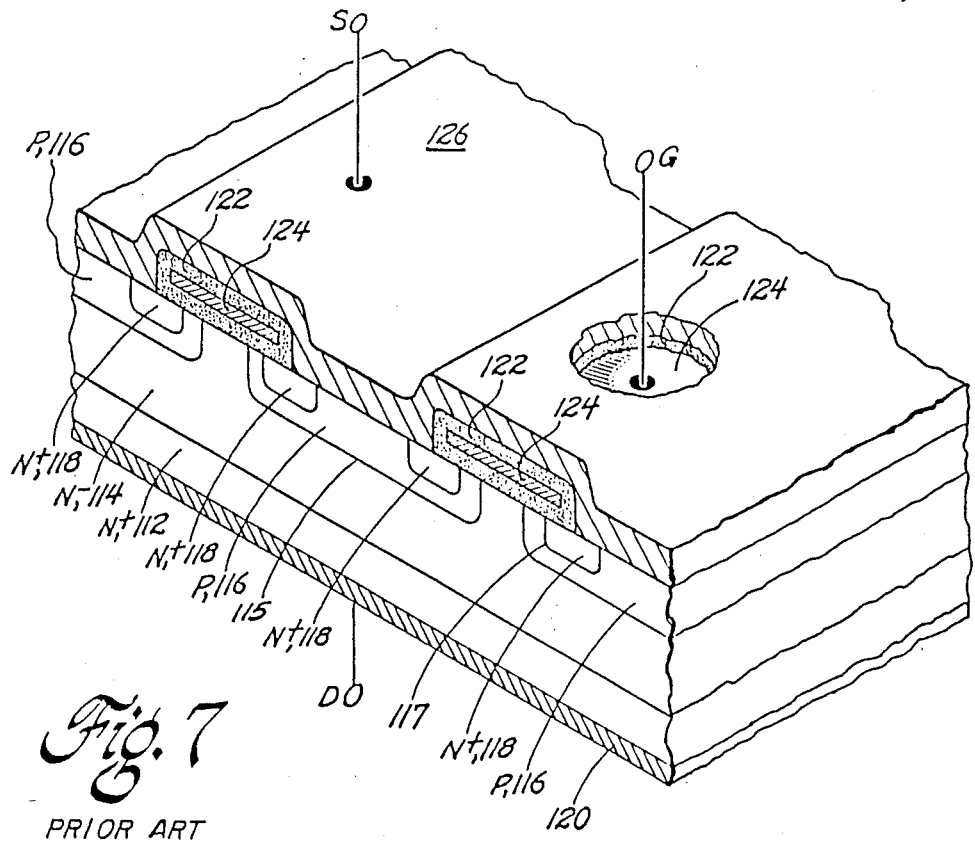
FIG. 7 illustrates, in cross-sectional view, a prior art FET.

This frequency limitation will be clearer from the following discussion of the prior art FET structure and its normal and synchronous rectifier uses. In FIG. 7 a prior art high voltage FET 110 is illustrated in cross section. The semiconductor portion of this FET comprises a drain region 112 which is heavily doped N type (N+), a drift region 114 which is lightly doped N type (N−), a body region 116 which is doped P type (P) and a source region 118 which is heavily doped N type (N+). The device illustrated is a vertical DMOSFET in which the drain region 112 forms the lower surface of the semiconductor wafer and the drift region, body region and source regions all extend to the upper surface of the wafer. A DMOSFET is an FET in which the length of the channel is determined by two successive diffusions (one P type and one N type) (known as double diffusion, thus the letter "D" in the device name) which are made through the same mask opening. The difference in lateral diffusion distance from the edge of the mask opening determines the channel length. A vertical DMOSFET is a DMOSFET in which the source and drain electrodes are on opposite surfaces of the semiconductor body which results in the main device current flowing vertically through the semiconductor wafer. A drain electrode 120 is disposed in ohmic contact with the drain region 112 along the lower surface of the wafer and has an external terminal marked D connected thereto. An insulated gate electrode 124 is spaced from the upper surface of the wafer by a gate insulating layer 122. The gate electrode 124 extends over the drift region where it extends to the upper surface, and over part of the source region and across the intervening portion of the body region 116. In this way, the potential of the gate electrode 124 relative to the body region 116 controls conduction through channels between the source regions 118 and the drift region 114. The gate electrode is indicated as having an external terminal G connected thereto. A source electrode 126 is disposed on the upper surface of the wafer, insulated from the gate electrode and in ohmic contact with the source region and the body region along the upper surface of the device and is illustrated as having an external terminal S connected thereto.

In normal operation of the FET shown in FIG. 7, the drain electrode D is held at a more positive voltage than the source electrode S. As a result, the PN junction 115 between the body region and the drift region is maintained in a reverse biased condition and the applied voltage tends to forward bias the PN junction 117 between the source region 118 and the body region 116. However, as can be seen from the illustration, the source electrode 126 short circuits this diode and thereby under normal operating conditions prevents it from becoming forward biased. As a consequence, forward biasing of a diode does not occur during normal first quadrant operation of this device.

Figure 9:
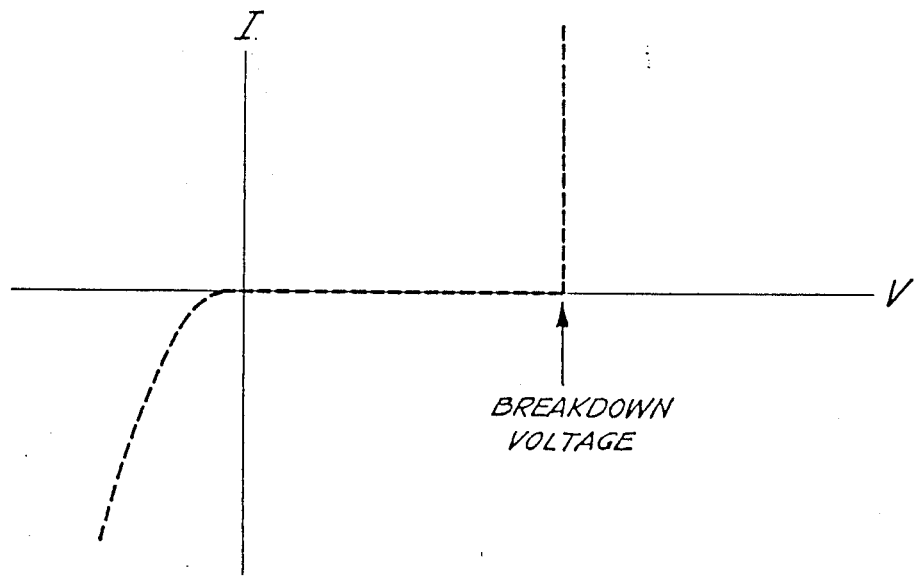
FIG. 9 illustrates the current vs. voltage (I/V) characteristic of a diode.

In FIG. 9, the current vs. voltage (I/V) characteristic for this device is illustrated with all four quadrants present. As can be seen, with an applied gate bias which maintains the device in an OFF condition in the first quadrant, no current flows through the device until the drain-to-source voltage reaches the breakdown voltage of the device at which point the device becomes highly conductive. Consequently, so long as the device is rated for the maximum applied voltage, conduction in the first quadrant is exclusively under the control of the applied gate voltage. However, in the third quadrant which corresponds to the drain voltage being more negative than the source voltage, it is the PN junction 115 between the body 116 and the drift region 114 which tends to become forward biased. This PN junction is not short circuited by any electrode, and is the parasitic diode which, in a synchronous rectification stage, turns ON to maintain current flow during the period that both FETs are OFF. Once turned ON, this diode injects holes into the drift region. This creates the stored charge in the "diode" which must be removed for the diode to turn OFF. Because of the high lifetime of carriers in the drift region, these stored holes take a long time to recombine and cause the long turn-off time for the diode, typically about 0.5 microseconds. This problem becomes significant as the operating frequency of the rectification stage is increased to more than about 0.5 Mhz or 1 MHz and limits the operating frequency to less than about 2 Mhz.

As the frequency is increased, a problem also develops with the bipolar parasitic transistor of which the source region 118 and drift/drain region 114/112 are the emitter and collector, respectively, and of which the body region 116 is the base. Too rapid a change in the voltage (dv/dt) across the source and drain terminals of the device causes capacitance effects to provide a sufficient base current to turn ON that parasitic transistor before the FET can turn ON and short circuit that parasitic transistor. The effect of turning ON the parasitic bipolar transistor is similar to that of forward biasing the parasitic diode and can also result in a second breakdown of the FET, thereby limiting the safe operating area (SOA) of the device. This turn ON of the parasitic bipolar transistor can easily destroy the FET. The maximum dv/dt across the FET occurs near the zero-crossings of the AC voltage itself because that is the point in the AC voltage where dv/dt is a maximum. The maximum dv/dt increases with increasing frequency for a given AC voltage amplitude.

For low frequency synchronous rectification (up to about 100 KHz to 1 MHz), the problem of slow turn-off by the parasitic diode may be avoided by use of FETs whose diode turn-off time is small enough for proper operation of the synchronous rectifier at those frequencies, although the device operation is still noisy because of the reverse turn-off current. However, as the frequency of the AC signal being rectified increases, diode turn-off time becomes a more critical limitation on circuit operation. It is presently considered desirable to obtain a capability for operating synchronous rectifier power supplies at frequencies which are too high for proper circuit operation with prior art FETs because of the slow diodes inherent in the FETs.

Figure 10:
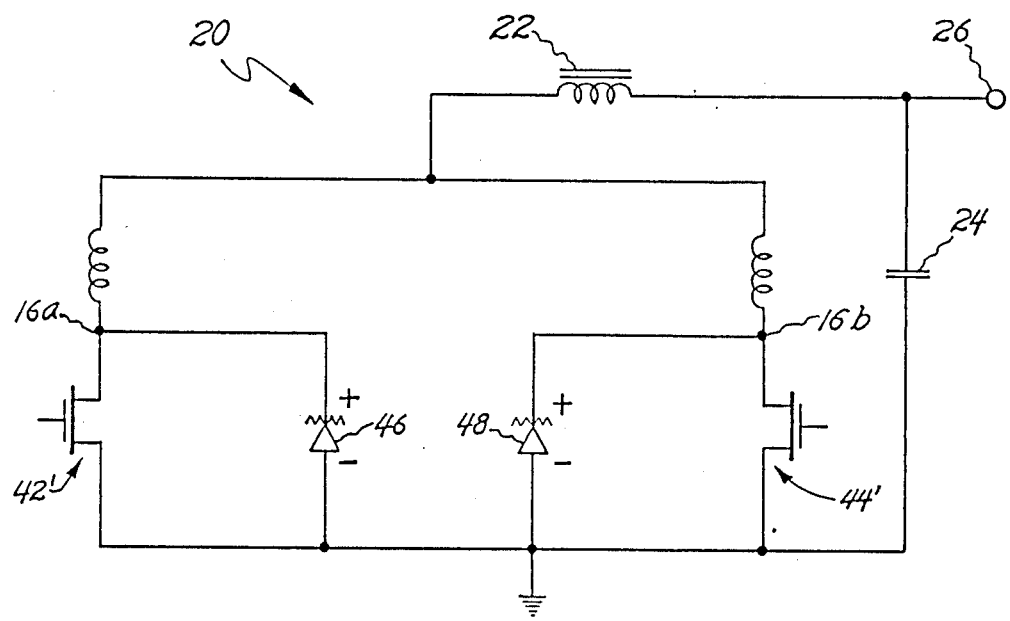
FIG. 10 is a schematic diagram of the isolation transformer/rectification stage of a synchronous rectifier system in accordance with the present invention.

The isolation/rectification stage of a synchronous rectifier circuit which overcomes the foregoing problems is shown schematically in FIG. 10. In this circuit, the output filter 20 has the input end of its inductor 22 connected to the common tap of the isolation transformer secondary winding. The first switching device 42' is connected between a first outer end 16a of the secondary winding and ground. A Schottky diode 46 is connected in parallel with device 42' with its anode connected to ground and its cathode connected to winding end 16a. A similar parallel connection between a second switching device 44' and a second Schottky diode 48 is connected between a second outer end 16b of the secondary winding and ground.

In the two switching devices 42' and 44' there either are no internal parasitic diodes or else any parasitic diodes that may be present are prevented from turning on by the presence of the parallel Schottky diodes 46 and 48, respectively. Care must be exercised in selecting the Schottky diodes to be connected in parallel with a FET which includes a parasitic diode because the Schottky diode will only be effective to prevent the parasitic diode from turning ON if (1) the Schottky diode has a turn-on voltage which is less than the turn-on voltage of the parasitic diode and (2) the Schottky diode has an ON-state voltage drop which results in the voltage applied across the parasitic diode always being less than the parasitic diode's turn-on voltage. Whenever the circuit conditions are such as to turn ON a diode to maintain current flow, the diode which turns ON is either Schottky diode 46 or Schottky diode 48 depending on which portion of the secondary winding is conducting the current at that time. Since a Schottky diode has a recovery time which is in the range from a few nanoseconds up to about 50 nanoseconds, a number of benefits accrue. First, this synchronous rectifier circuit can be operated at much higher frequencies than synchronous rectifier circuits employing prior art field effect transistors as their switching devices because the turn-off time of the Schottky diodes does not limit circuit operating frequency unless that operating frequency is raised into the tens or hundreds of megahertz. Second, since a Schottky diode has such a short recovery time and a minimal or non-existent charge to be removed during the recovery time, the reverse current which flows in the secondary winding during the diode turn-off time is miniscule as compared to the current which flows when the parasitic diode in a prior art FET has to be turned OFF. This minimizes or eliminates the problem of ringing in the secondary winding with the result that the output voltage at the output terminal 26 of the isolation/rectification stage 10' is much less noisy than that of the prior art isolation/rectification stage 10 of FIG. 2. Consequently, the isolation/rectification stage 10 of FIG. 2 exhibits better performance than that of FIG. 2. It will be recognized that while the switching devices 42' and 44' are shown as having separate Schottky diodes connected thereacross, these diodes are preferably integrated in the same chip with their associated respective devices 42' and 44', or even within the FET itself. Such integration provides the advantage of having a three terminal device (source, drain and gate) which can be directly substituted for a prior art FET in a synchronous rectifier and, more importantly for high frequency use, also minimizes inductances in the connection of the Schottky diodes. Any lead inductance between the Schottky diode and the FET results in delays at high frequencies with the result that the Schottky diode cannot act in an ideal manner. Thus, this minimization of inductance has a substantial beneficial effect on circuit operation.

Figure 3:
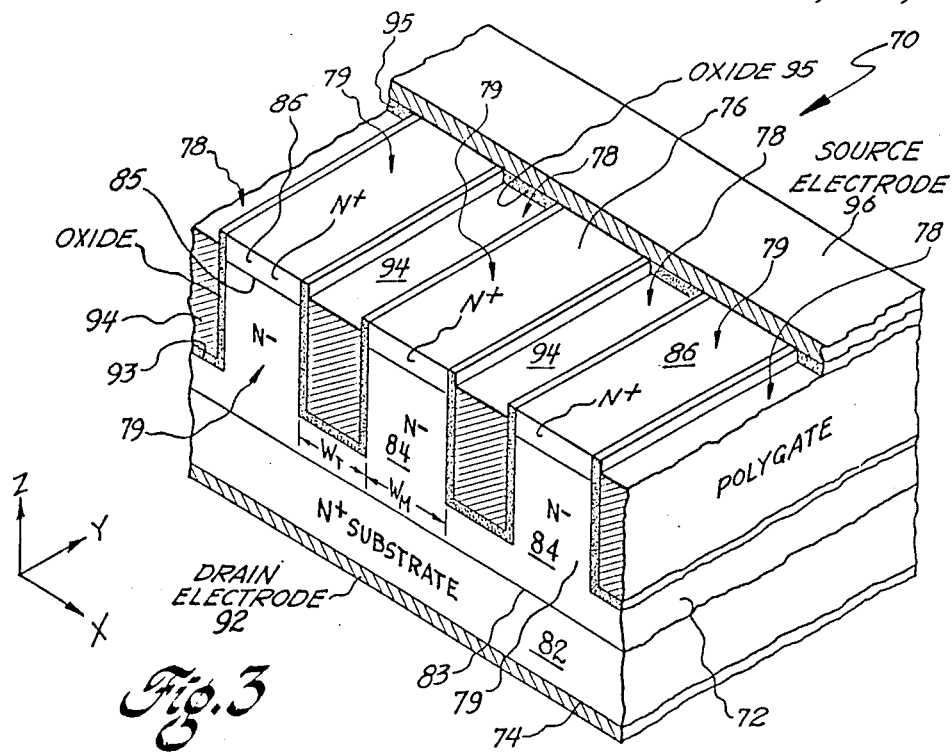
FIG. 3 is a perspective, partially cross-sectional, partially cut away illustration of one embodiment of an FET device which is fabricated of all N-type semiconductor material.

In accordance with the present invention, use of all N-type field effect switching devices as the rectifying devices 42' and 44' in the isolation/rectification stage of a synchronous rectifier as shown in FIG. 10 eliminates those parasitic devices which limit circuit operating frequencies. One such device 70 is illustrated in FIG. 3. An orthogonal XYZ coordinate system is included in FIG. 3 in order to provide an easy direction reference in the following description. The device 70 is an all N-type semiconductor device and contains no P-type semiconductor material. Device 70 comprises a body of semiconductor material 72 having a lower surface 74, an upper surface 76, and three layers 82, 84 and 86 of N type material having differing doping levels. The lowermost layer 82 is heavily doped N type (N+) and is referred to as the drain region of the device in accordance with normal FET terminology. Layer 82 should be doped to a donor dopant level of at least $1 \times 10^{18}$ atoms/cm$^3$. This layer may comprise the substrate portion of a semiconductor wafer on which the other layers are formed by epitaxial growth or other techniques. The layer 84 is disposed contiguous to the layer 82 and forms an interface 83 therewith. The layer 84 is referred to as the drift region of the device in accordance with common power FET terminology and is doped N type, but to a lesser conductivity level than the layer 82. The layer 84 in this embodiment may preferably have an N type doping level in the range from $5 \times 10^{15}$ to $1 \times 10^{17}$ atoms/cm$^3$, with a doping level of $4 \times 10^{16}$ atoms/cm$^3$ being preferred for a 50 volt device. The third layer 86 is disposed on top of and contiguous with the layer 84 in the drawings and forms an interface 85 therewith. Layer 86 is referred to as the source region and should be doped to at least $1 \times 10^{18}$ donor dopant atoms/cm$^3$.

A trench structure 78 extends into the body 72 from the upper surface 76 in the drawing and defines or creates a mesa structure 79 which extends from the bottom of the trench to the upper surface 76 of the semiconductor body. The trenches have an X-direction trench width $W_T$. The trench structure 78 extends through the source region 86 into the drift region 84 of the device. The trench 78 in this device does not extend entirely through the drift region 84 and thus is spaced from the drain region 82. The side wall surfaces of the mesa and the bottoms of the trenches 78 are oxidized or otherwise have a gate insulating layer formed thereon. The rest of the trench is filled with a gate electrode material 94, except for the very top of the trench just under the source electrode 96 where an insulating layer 95 is disposed to insulate the gate electrode from the source electrode. This is a normally ON device. The width $W_M$ of the mesas 79 in the X direction is made small enough that application of an appropriate bias voltage to the conductive portion of the insulated gate electrode 94 pinches off the drift layer segment of the mesa. This causes the device to be non-conductive between its source electrode 96 and its drain electrode 92. The width $W_M$ of the mesa in silicon may preferably be in the range of 1 to 5 microns. A value of about 1 microns is preferred. The nonconductive state is a first state of the device and is a result of the voltage on the gate electrode relative to the voltage in the drift region being sufficiently negative that depletion and pinch off of the drift region results. A second, conductive state of the device results from the gate electrode being at a less negative voltage which enables the drift region segment of the mesa to have many mobile charge carriers therein and hence to be highly conductive.

A device of this type designed to withstand a voltage of 25 to 50 volts applied across its source and drain electrodes when it is being held in an OFF state without breaking down and becoming conductive should have a minimum specific ON-state resistance of about 0.1 milliohm-$cm^2$ for source and drain doping levels of $1 \times 10^{19}$ atoms/$cm^3$, a drift region doping level of about $4 \times 10^{16}$ atoms/$cm^3$, an overall device thickness of 10 mils and a drift region thickness of 3 mils, with the width $W_M$ being 1 micron and the width $W_T$ of the trenches being 1 micron.

It will be understood that in FIG. 3 (and FIGS. 4–6 to be discussed hereinafter) the source electrode is only shown toward the back of the drawing in order to more clearly illustrate the structure of the device, but in the actual device, the source electrode extends over and makes contact with substantially the entire source region. Also, in order to keep the resistance of the gate electrode within the desired limits, it may be desirable to interconnect adjacent gate electrode segments at Y-direction intervals in the FIGURE.

Figure 4:
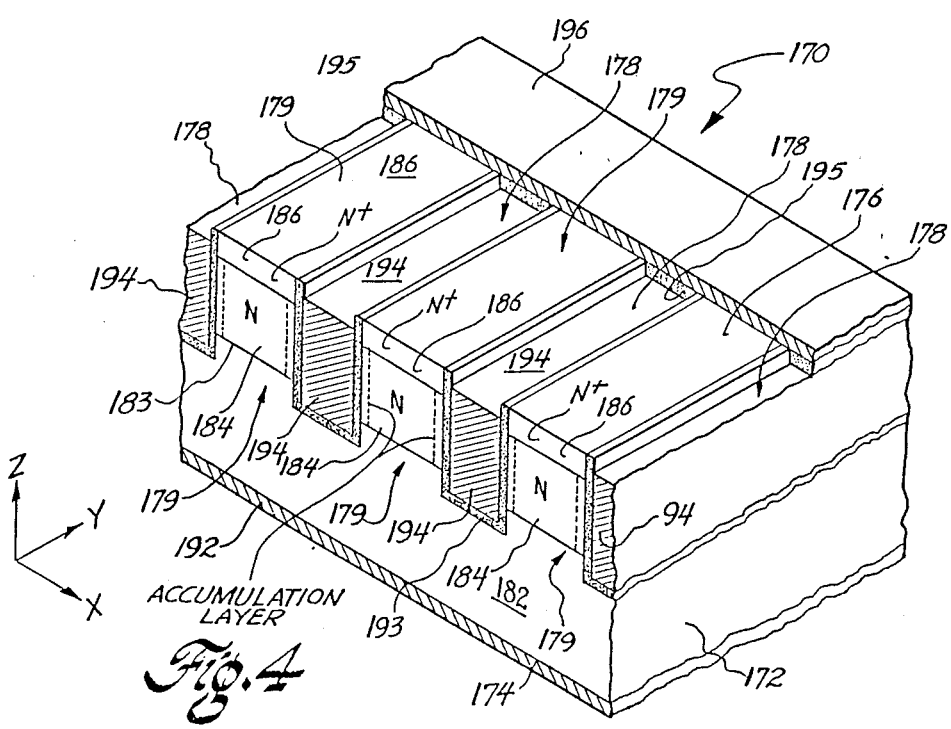
FIG. 4 is a perspective, partially cross-sectional, partially cut, away illustration of one embodiment of an all N-type semiconductor field effect device.

A preferred all N-type FET 170 is shown in FIG. 4 in a perspective cross-sectional view. Corresponding structures in the two devices 70 and 170 have been provided with corresponding reference numbers with the reference numerals in device 170 of FIG. 4 increased by 100 relative to those of FIG. 3. Device 170 is structurally and operationally very different from device 70 in that the doping level of the drift region 184 of device 170 is substantially lower than that of drift region 84 in device 70 of FIG. 3 and for the same voltage rating the drift region 184 is substantially thinner than the drift region 84 of device 70. In device 170, it is preferred to dope drift region 184 to between $1 \times 10^{13}$ and $1 \times 10^{17}$ donor atoms/$cm^3$, with a doping level of $5 \times 10^{13}$ atoms/$cm^3$ being preferred for a 50 volt device. Finally, the trenches 178 in device 170 extend entirely through the drift region 184 into the drain region 182 so that the mesa 179 has its base in the drain region and the insulated gate electrode 194 extends the full vertical height of the drift region 184.

The device 170, like the device 70, is rendered non-conductive through the depletion of the mesa segment of the drift region 184 in one state as a result of the relative voltage between the gate electrode 194 and the drift region 184 and in a second state is rendered conductive as a result of the relative potential between the gate electrode 194 and the drift region 184. However, it differs significantly from device 70 as a result of the low doping level of the drift region 184, which enables device 170 to be rendered non-conductive at a zero voltage differential between the drift region 184 and the gate electrode 194 by appropriate selection of the gate electrode material. This is a normally-OFF device. It will be recognized that this potential difference can be applied between the source electrode and the gate electrode since the source and drift regions are in direct ohmic contact. This gate material may be a doped polysilicon, a metal or other appropriate conductive material. Alternatively, this device can be designed to be normally ON.

The normally-OFF device is rendered conductive by applying a positive voltage to the gate electrode 194 relative to the drift region 184. This positive voltage causes an accumulation layer of electrons to form adjacent to the gate electrode along each of the vertical edges of the drift region 184 as shown by the dashed lines in FIG. 4. Because gate electrode 194 extends through the full thickness of the drift region, this accumulation layer extends from the source region 186 to the drain region 182. This accumulation layer is highly conductive because it contains a high density of mobile electrons therein and because electrons have a high mobility in silicon. Further, because this gate-voltage-induced concentration of electrons is an accumulation layer, the electron mobility therein decreases only slightly as a result of surface roughness at the interface between the drift region 184 and the gate insulator 193. If this electron concentration were instead an inversion layer (as it would be in the prior art where the body region is of opposite conductivity to the source and drain regions), then the electron mobility would be decreased much more by surface roughness effects. In silicon, accumulation layer mobility is between three and four times larger than inversion layer mobility.

The normally-ON device is made conductive at zero volts by a combination of selection of the drift region doping level and the gate electrode composition. The normally-ON device is rendered non-conductive by applying a negative voltage to the gate electrode 194 relative to the drift region. However, the resistance of this normally-ON device is not at its minimum value at a gate bias voltage of zero volts because of the low doping level in the drift region. Therefore, it is desirable to apply a positive gate bias voltage to obtain minimum ON-resistance.

In this accumulation mode device it is important, in order to obtain minimum ON-resistance, that the gate electrodes extend through the full thickness of the low-doping-level drift region so that the accumulation layer will extend from the source region to the drain region without any gap. A gap in the accumulation layer between the source and drain regions would reduce the overall conductivity of the device.

An accumulation device in accordance with this embodiment having an overall thickness of 5 mils and a drift region thickness of 3 microns with a doping level of about $5 \times 10^{13}$, with 3 micron wide trenches and 3 micron wide mesas, should have a specific ON-resistance of about 0.025 milliohm-$cm^2$, under accumulation using a gate bias of 10 volts across a 500 Angstrom thick gate oxide. This is a factor of 8 better than the prior art 25 volt structure and is substantially better than is obtained with device 70 of FIG. 3 or any prior art field effect transistor structure and is a substantial advantage in reducing the voltage drop across the switching devices of a synchronous rectifier. Also significant for use at very high frequencies, such as 1 MHz and above, is this structure's total absence of parasitic bipolar devices. As a consequence, there is no parasitic diode which can turn on to conduct the current drawn by the inductor 22. As a result, the operating frequency of such power supply is no longer limited by parasitic device considerations in the switching devices. However, some other mechanism (such as the Schottky diodes shown in FIG. 10) must be provided to conduct the inductor 22 current when both FETs are OFF.

The device of FIG. 4 is shown with the trenches and the gate electrodes arranged in parallel straight lines which extend in the Y-direction in the figures. This structure is presently preferred. However, the invention can alternatively be embodied in any desired trench configuration including, but not limited to, trenches which leave hexagonal, rectangular, circular or other shape mesas.

Figure 5:
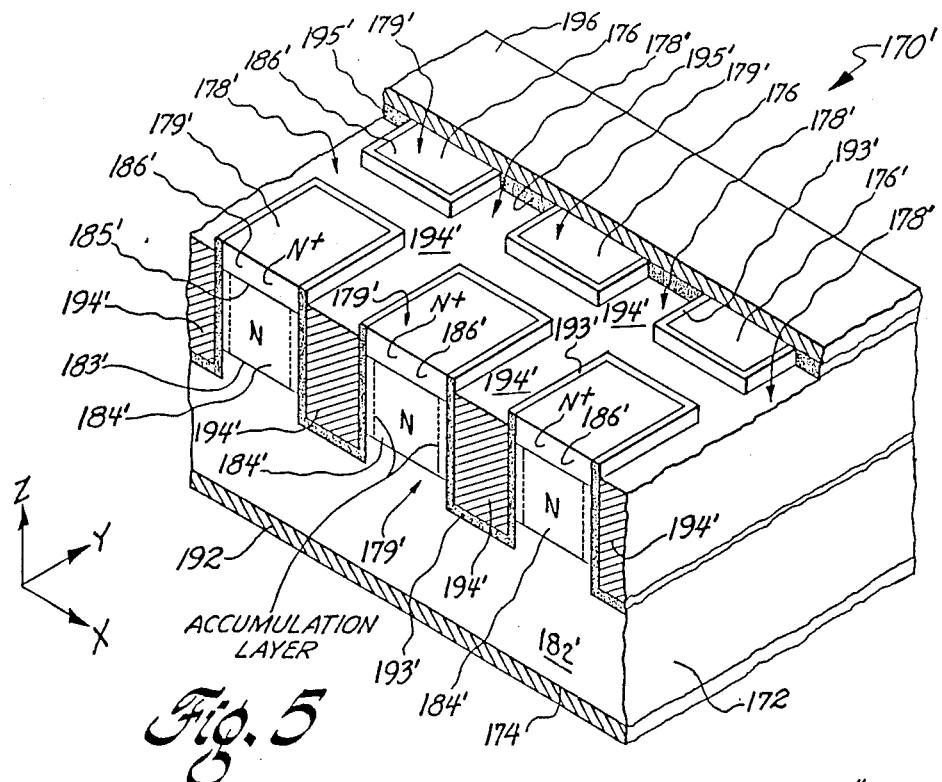
FIG. 5 illustrates a modified version of the device of FIG. 4.

One example of an alternative mesa configuration is shown in FIG. 5 where the device 170' contains a plurality of spaced apart rectangular mesas 179' in which the source region segment and the drift region segment of each mesa are spaced apart from all other source and drift region segments by the trenches 178' and the gate electrode 194' therein. This provides an interconnected gate electrode.

In FIG. 4, the various mesa segments appear to be unconnected. However, they may be connected in a portion of the device which is not shown in this figure whereby there is only one, continuous mesa in the device. Such a structure is shown explicitly in FIG. 6 where, in the device 170'', the mesa structure 179'' includes a cross connecting portion and the trench structure 178'' comprises a plurality of separate trenches. In the structure of device 170'', care must be taken that the portion of the mesa at the crossing center (where the cross connection crosses one of the parallel Y direction segments) is close enough to the gate electrode segments 194'' that it becomes depleted when the depletion potential is applied to the gate electrode. In both FIGS. 5 and 6, each portion of the structure has the same reference numeral as it has in FIG. 4. Those whose configuration is significantly changed have the same suffix (' or '') as the device number in that figure.

The exceedingly low specific ON-resistance of devices in accordance with this invention makes the contact resistances between the source electrode and source region and the drain electrode and the drain region critical contributors to the overall ON-state voltage drop of the device. Consequently, to obtain the full benefit of the semiconductor structure of this device, very low resistance source and drain electrode contacts must be included in the device. To this end, silicided contacts are presently considered desirable. The device of FIG. 4 can be designed to hold off maximum applied voltages of up to 50 volts. For higher voltages, device internal breakdown voltages become a significant concern because of the need for the gate dielectric to support the full source-to-drain voltage across the device in the OFF state. The breakdown voltage can be increased by using a thicker oxide layer near the bottom of the trenches. Special designs must be used if the maximum voltage is increased significantly in silicon devices.

Devices with maximum voltage of 25 to 50 volts can meet all of the circuit requirements for properly designed synchronous rectification stages having DC output voltages ranging up to about 5 volts.

It is presently preferred to fabricate devices in accordance with this invention as vertical devices because of efficient current flow, economy of structure, and a natural tendency for the current to flow between the top and bottom power contacts in response to voltages applied thereacross, all without the current having a tendency to flow in an undesired direction. However, devices in accordance with this invention may alternatively be designed as lateral devices if desired. However, such lateral devices require care in their design in order to provide specific ON-resistances as low as in the vertical versions of the device built with the same design rules.

Devices in accordance with this invention are preferably fabricated by first forming the three layers (drain, drift and source) as a wafer having substantially planar surfaces. This may be done by epitaxial growth of the drift and source layers on a drain layer substrate or by diffusion of source and drain layers into a drift layer substrate. Preferably, the substrate is the drain region, the drift region is epitaxially grown on the drain region substrate and the source region is diffused into the drift region. The trenches are then formed by appropriate removal processes such as reactive ion etching (RIE). Thereafter the mesa side walls and trench bottoms are oxidized to form the gate insulator. A thicker oxide layer near the bottom of the trench and/or rounding the bottom of the trench is desirable where breakdown at the trench bottom is a concern. A thicker oxide may be provided on the bottom of the trenches by implanting oxygen into the silicon at the bottom of the trenches prior to growth of the gate oxide. Where the trenches are formed by RIE, it is desirable to grow and remove a layer of oxide prior to growing the gate oxide in order to remove some of the damage created by the RIE process. However, this is less necessary with this all N-type structure than it would be with an NPN structure. After formation of the gate oxide, the gate conductor is deposited in the trenches and an insulating layer is formed over the gate conductor. Thereafter source and drain electrodes are formed on the source and drain regions, respectively. Other fabrication methods may alternatively be used. Further information on the formation of devices of this general structure may be found in the above-identified incorporated-by-reference Temple applications, especially the method application entitled "Method of Fabricating a Semiconductor Device", Ser. No. 938,666.

Figure 6:
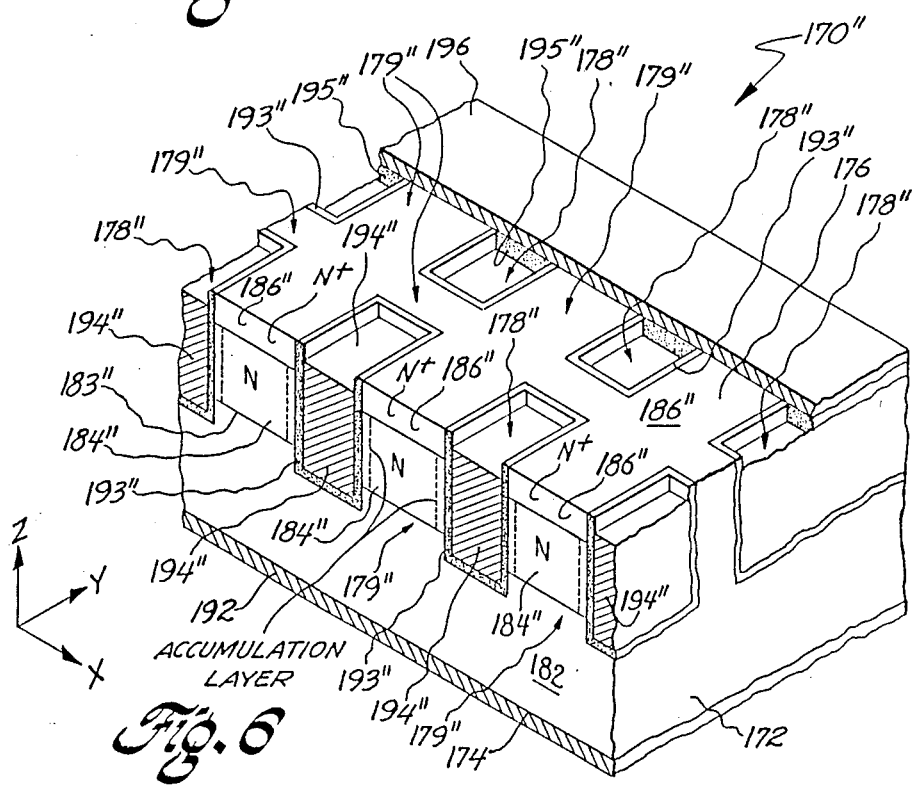
FIG. 6 illustrates another modified version of the device of FIG. 4.

While the devices of FIGS. 4-6 have each been shown as three layer devices having a source region, drift region and a drain region with each of these three regions having only one part, these devices may alternatively be fabricated with the drift region having two or more different segments, each having a different doping level in accordance with specific desired operating characteristics. The use of all N-type devices in accordance with this invention as the rectifying devices in a synchronous rectifier circuit increases its potential operating frequency to well in excess of 1 MHz and thereby eliminates the operating characteristics of the rectifying devices as the frequency limiting component of the synchronous rectifier circuit system.

While the invention has been described in detail herein in accord with certain preferred embodiments thereof, many modifications and changes therein may be effected by those skilled in the art. For example, devices can be fabricated in all P type material or in semiconductor materials other than silicon. The embodiments of FIGS. 3 and 4 may be combined in a single device, if desired, with some portions in accordance with FIG. 3 and some in accordance with FIG. 4. The trenches may have configurations other than straight vertical walls and the oxide configuration can be tailored to particular needs. Accordingly, it is intended by the appended claims to cover all such modifications and changes as fall within the true spirit and scope of the invention.

What is claimed is:

1. In a high efficiency synchronous rectifier circuit of the type including switching devices whose conductive state is controlled by an external control signal, a transformer for supplying an AC voltage to said switching devices for rectification and an output terminal, the improvement comprising:
   each of said switching devices comprising:
      an insulated gate field effect transistor in which all of the semiconductor material is of a single conductivity type, and
      a diode connected in parallel with said field effect transistor in an orientation to conduct transient currents in its forward direction when said field effect transistor is non-conductive; and
   said switching devices, said transformer and said output terminal being interconnected so that a current path from said transformer to said output terminal is free of series connections of said switching devices.

2. The synchronous rectifier circuit recited in claim 1 wherein:
   each of said switching devices consists of a single chip in which said field effect transistor and said diode are integrated.

3. The synchronous rectifier circuit recited in claim 2 wherein:
   said integrated switching device is a three terminal device having said diode connected between source and drain electrodes of said field effect transistor with the three terminals being source, drain and gate terminals.

4. The synchronous rectifier circuit recited in claim 3 wherein:
   said diodes are Schottky diodes.

5. The synchronous rectifier recited in claim 4 wherein:
   said insulated gate field effect transistor is an accumulation mode device having heavily doped source and drain regions spaced apart by a lightly doped drift region, said drift region having an insulated gate electrode adjacent thereto, said device being rendered conductive by application of a gate voltage to said gate electrode which induces an accumulation layer within said drift region adjacent to said gate electrode.

6. The synchronous rectifier circuit recited in claim 1 wherein:
   said diodes are Schottky diodes.

7. The synchronous rectifier circuit recited in claim 1 wherein:
   said transformer is designed to operate at frequencies in excess of 2 MHz; and
   said diodes have a reverse recovery time of less than 100 nanoseconds.

8. The synchronous rectifier recited in claim 1 wherein:
   said insulated gate field effect transistor is an accumulation mode device having heavily doped source and drain regions spaced apart by a lightly doped drift region, said drift region having an insulated gate electrode adjacent thereto, said device being rendered conductive by application of a gate voltage to said gate electrode which induces an accumulation layer within said drift region adjacent to said gate electrode.

9. The synchronous rectifier circuit recited in claim 1 wherein said transformer includes a secondary winding including first and second portions connected in common to a center tap and having first and second outer terminals, respectively and said circuit further comprises:
   an output filter providing its output at said output terminal and having an input terminal and a reference terminal, said input terminal being connected to said center tap of said transformer;
   a first one of said switching devices connected between said first outer terminal and said reference terminal; and
   a second one of said switching devices connected between said second outer terminal and said reference terminal.

10. The synchronous rectifier circuit recited in claim 9 wherein:
    said switching devices are oriented with the anode of said diode connected to said reference terminal for positive DC voltages at said output terminal relative to said reference terminal.

11. The synchronous rectifier circuit recited in claim 9 wherein:
    said transformer is designed to operate at frequencies in excess of 2 MHz; and
    said diodes have a reverse recovery time of less than 100 nanoseconds.

12. In a high efficiency synchronous rectifier circuit of the type including switching devices whose conductive state is controlled by an external control signal, a transformer for applying an AC voltage to said switching devices for rectification and an output terminal, the improvement comprising:
    each of said switching devices comprising:
       an insulated gate field effect transistor in which all of the semiconductor material is of a single conductivity type, and
       a Schottky diode connected in parallel with said field effect transistor in an orientation to conduct transient current in its forward direction when said field effect transistor is non-conductive; and
    said switching devices, said transformer and said output terminal being interconnected so that a current path from said transformer to said output terminals is free of series connections of said switching devices.

13. The synchronous rectifier circuit recited in claim 12 wherein:
    each of said switching devices consists of a single chip in which said field effect transistor and said diode are integrated.

14. The synchronous rectifier circuit recited in claim 13 wherein:
    said integrated switching device is a three terminal device having said Schottky diode connected between source and drain electrodes of said field effect transistor with the three terminals being source, drain and gate terminals.

15. The synchronous rectifier recited in claim 14 wherein:
    said insulated gate field effect transistor is an accumulation mode device having heavily doped source and drain regions spaced apart by a lightly doped drift region, said drift region having an insulated gate electrode adjacent thereto, said device being rendered conductive by application of a gate voltage to said gate electrode which induces an accumulation layer within said drift region adjacent to said gate electrode.

16. The synchronous rectifier circuit recited in claim 12 wherein said transformer includes a secondary winding including first and second portions connected in common to a center tap and having first and second outer terminals, respectively, further comprising:
   an output filter having input, output and reference terminals, said input terminal being connected to said center tap of said transformer;
   a first one of said switching devices connected between said first outer terminal and said reference terminal; and
   a second one of said switching devices connected between said second outer terminal and said reference terminal.

17. The synchronous rectifier circuit recited in claim 16 wherein:
   said switching devices are oriented with the anode of said Schottky diode connected to said reference terminal for positive DC voltages at said output terminal relative to said reference terminal.

18. The synchronous rectifier circuit recited in claim 16 wherein:
   said transformer is designed to operate at frequencies in excess of 2 MHz; and
   said diodes have a reverse recovery time of less than 100 nanoseconds.

19. The synchronous rectifier circuit recited in claim 12 wherein:
   said transformer is designed to operate at frequencies in excess of 2 MHz; and
   said diodes have a reverse recovery time of less than 100 nanoseconds.

20. The synchronous rectifier recited in claim 12 wherein:
   said insulated gate field effect transistor is an accumulation mode device having heavily doped source and drain regions spaced apart by a lightly doped drift region, said drift region having an insulated gate electrode adjacent thereto, said device being rendered conductive by application of a gate voltage to said gate electrode which induces an accumulation layer within said drift region adjacent to said gate electrode. S

* * * * *